(12) United States Patent
Takeuchi et al.

(10) Patent No.: US 6,285,112 B1
(45) Date of Patent: Sep. 4, 2001

(54) SURFACE ACOUSTIC WAVE DEVICE COMPRISING LANGASITE SINGLE CRYSTAL SUBSTRATE

(75) Inventors: Masao Takeuchi, 1810-1, Kogasaka, Machida City, Tokyo (JP); Mitsuhiro Tanaka, Chita (JP); Yuichiro Imanishi, Nagoya (JP)

(73) Assignees: NGK Insulators Ltd.; Masao Takeuchi, both of (JP)

( * ) Notice: Subject to any disclaimer, the term of this patent is extended or adjusted under 35 U.S.C. 154(b) by 0 days.

(21) Appl. No.: 09/038,006

(22) Filed: Mar. 11, 1998

(30) Foreign Application Priority Data

Mar. 14, 1997 (JP) .................................... 9-061462

(51) Int. Cl.$^7$ ................................................. H01L 41/08
(52) U.S. Cl. ........................................................ 310/313 A
(58) Field of Search ............................. 310/313 R, 313 A

(56) References Cited

U.S. PATENT DOCUMENTS

| | | | |
|---|---|---|---|
| 4,410,823 | * 10/1983 | Miller et al. | 310/313 D |
| 5,438,306 | * 8/1995 | Yamanouchi et al. | 310/313 B |
| 5,581,141 | * 12/1996 | Yamada et al. | 310/313 B |
| 5,698,927 | * 12/1997 | Tanaka et al. | 310/313 A |
| 5,773,911 | * 6/1998 | Tanaka et al. | 310/313 A |
| 5,821,673 | * 10/1998 | Pisarevsky et al. | 310/313 A |
| 5,917,265 | * 6/1999 | Naumenko et al. | 310/313 A |

FOREIGN PATENT DOCUMENTS

| | | | |
|---|---|---|---|
| 0 704 966 A2 | 4/1996 | (EP) | H03H/9/145 |
| 0 810 725 A2 | 12/1997 | (EP) | H03H/9/02 |
| 0 866 551 | * 9/1998 | (EP) | 310/313 A |
| 10-327038 | * 9/1998 | (JP) | 310/313 A |
| 11-27089 | * 1/1999 | (JP) | 310/313 A |
| 97/25776 | * 7/1997 | (WO) | 310/313 A |
| 97/49182 | * 12/1997 | (WO) | 310/313 A |

OTHER PUBLICATIONS

Aleksandrov et al., Effects of Static Electric Field and of Mechanical Pressure on Surface Acoustic Waves Propagation in [Langasite] Piezoelectric Single Crystals, IEEE Ultrasonics Symposium, 409–412, Nov. 7, 1995.*

Yakovkin et al., Numerical and Experimental Investigation Saw in Langasite, IEEE Ultrasonics Symposium, 389–392, Dec. 1995.*

Dubovik et al., "Langasite (La3Ga5SiO14) An Optical Piezoelectric: Growth and Properties" IEEE International Frequency Control Symposium, XP 000674152, pp. 43–47, Jan. 1994.

Yakovkin et al., "Numerical and Experimental Investigation Saw in Langasite", IEEE Ultrasonics Symposium, XP–002112466, pp. 389–392, Jun. 1995.

"Filter and Resonator Using Langasite"; 1996 IEEE International Frequency Control Symposium; Mitsuru Sato, Katsuma Moroishi and Sumiyuki Ishigami (Tokyo Denpa Company, Ltd., Tokyo, Japan), Dec. 1996.

* cited by examiner

Primary Examiner—Thomas M. Dougherty
(74) Attorney, Agent, or Firm—Parkhurst & Wendel, LLP

(57) ABSTRACT

A surface acoustic wave device including a substrate and an electrode structure formed on the substrate, said substrate being made of an X-cut Langasite single crystal, a rotation Y-cut Langasite single crystal or a double rotation Y-cut Langasite single crystal. When the X-cut Langasite crystal having a large reflection coefficient is used, the electrode structure is formed to constitute a surface acoustic wave resonator. When the rotation Y-cut Langasite crystal having a large electro-mechanical coupling coefficient and a small reflection coefficient is used, the electrode structure is formed to constitute a surface acoustic wave filter. When the double rotation Y-cut Langasite crystal having an NSPUDT property is used, the electrode structure is formed to constitute a surface acoustic wave filter having a low insertion loss and an excellent phase property.

13 Claims, 15 Drawing Sheets

X-CUT: X - θY (90, 90, θ)

SURFACE ACOUSTIC WAVE DEVICE COMPRISING LANGASITE SINGLE CRYSTAL SUBSTRATE

BACKGROUND OF THE INVENTION

1. Field of the Invention

The present invention relates to a surface acoustic wave device such as surface acoustic wave (SAW) filter, surface acoustic wave resonator and surface acoustic wave guide, and more particularly relates to a surface acoustic device having an electrode structure which can realize a natural single-phase unidirectional transducer property.

2. Description of the Related Art

Heretofore, the surface acoustic wave device has been desired to have large electromechanical coupling coefficient $K^2$, small power flow angle PFA, small reflection by electrodes due to elastic perturbation, small temperature coefficient of delay time TCD and so no. Furthermore, recent electronic devices have been required to be small in size, light in weight and economical in power.

There has been widely used a transversal type surface acoustic wave device including a substrate having a piezo-electric property, a transmitter side transducer having inter-digitally arranged positive and negative electrodes which are connected to two opposite phase output terminals of a single-phase signal source and a receiver side transducer having interdigitally arranged positive and negative electrodes. Such a transversal type surface acoustic wave filter has been used for extracting a signal component within a given frequency range.

In such a surface acoustic wave filter, it has been required to reduce an insertion loss and to suppress undesired ripple connects within a given frequency range. Since usual electrode structures have a bidirectional property, the insertion loss could not be reduced smaller than a theoretical insertion loss of 6 dB. This insertion loss of 6 dB is too large to realize a SAW filter having a desired property.

In order to mitigate such a drawback, there has been proposed a multi-transducer system, in which on both sides of each of a plurality of transmitter side transducers there are arranged a pair of receiver side transducers. In a surface acoustic wave filter of such a multi-transducer system, it is possible to reduce the insertion loss to about 1.5–2.0 dB. However, in the multi-transducer system, the control of a plurality of transducers is very difficult and good phase property and frequency property could not be attained. Moreover, it is quite difficult to manufacture such a multi-transducer system device. In order to improve the faculty of the surface acoustic wave device, it is also very important to flatten a phase characteristic and to suppress pass band ripples and suppression band.

It has been proposed to use a unidirectional transducer which can realize a very small insertion loss which is theoretically lower than 1 dB and has excellent phase and frequency characteristics. There have been proposed various types of the unidirectional transducers. They may be roughly classified into (a) multi-phase type unidirectional transducer, and (b) single-phase type unidirectional transducer. As the latter single-phase type unidirectional transducer, there have been proposed various types. For instance, there have been proposed a single-phase unidirectional transducer utilizing an asymmetry of electrode structure and an internal reflection due to the mass load effect, a reflection bank type unidirectional transducer having a reflection bank between exiting electrodes, a single-phase unidirectional transducer utilizing a reflection by floating electrodes, and a natural single-phase unidirectional transducer utilizing anisotropic property of a substrate. In surface acoustic wave devices including these unidirectional transducers, the directionality is realized by making exciting wave and reflected wave to be in-phase in a wave propagating direction and to be opposite phase in an opposite direction.

Heretofore, substrates of surface acoustic wave devices are made of single crystals of quartz, lithium tantalate ($LiTaO_3$) and lithium niobate ($LiNbO_3$). In U.S. Pat. No. 5,698,927, there has been proposed to use a lithium tetraborate ($LiB_4O_7$) single crystal as a substrate of the natural single-phase unidirectional transducer. However, the known single crystals are not optimal for the surface acoustic wave device and it is difficult to obtain a surface acoustic wave filter having desired characteristics.

For instance, in order to realize a surface acoustic wave resonator, it is required that the electro-mechanical coupling coefficient $K^2$ is large, the reflection is large, the power flow angle PFA is small and the temperature dependency TCD is small. However, the electro-mechanical coupling coefficient $K^2$ of quartz is about 0.2 and the reflection of quartz is also small. Therefore, it is rather difficult to realize a surface acoustic wave resonator having good characteristics by using the quartz.

A substrate for the surface acoustic wave filter is required to have a large electro-mechanical coupling coefficient, a small reflection, a small power flow angle and a small temperature dependency. However, a piezo-electric substrate having such characteristics has not been proposed.

In the above mentioned known single-phase unidirectional transducer except for the natural single-phase unidirectional transducer, the electrode structure has become very complicated. Particularly, a distance between adjacent electrode edges and a width of an electrode have to be smaller than $\lambda/4$. Upon increasing an operation frequency, said distance and width become very small, and it is quite difficult to manufacture electrodes having small distance and width.

In order to mitigate the above mentioned drawbacks, there has been proposed a natural single-phase unidirectional transducer (NSPUDT), in which the unidirectionality is realized by utilizing the anisotropy of the piezoelectric substrate although the normal type electrode structure having an electrode edge distance of $\lambda/4$ and an electrode width of $\lambda/4$. In the surface acoustic wave device using the NSPUDT operation, as the piezoelectric substrate showing the anisotropy there have been known quartz substrate, $LiNbO_3$ substrate and $LiTaO_3$ substrate. However, in these known piezoelectric substrates, the electromechanical coupling coefficient $K^2$ is small, the temperature coefficient of delay time TCD is not zero, the power flow angle PFA is not zero and a directionality inverted electrode structure could not be realized easily. Due to such problems, it is very difficult to realize an ideal surface acoustic wave device.

Furthermore, in order to obtain a surface acoustic wave device which is small in size, light in weight and low in power consumption, it is advantageous to make a propagating velocity of a surface acoustic wave lower. However, the above mentioned piezoelectric substrates have a relatively high velocity not lower than 3000 m/sec. Therefore, it is difficult to realize a small, light and low power surface acoustic wave device by using the known piezoelectric substrates.

SUMMARY OF THE INVENTION

The present invention has for its object to provide a novel and useful surface acoustic wave device, which can remove or at least mitigate the above mentioned drawbacks of the known surface acoustic wave devices and which can be constructed as a surface acoustic wave resonator and a surface acoustic wave filter having excellent property.

According to a first aspect of the invention, a surface acoustic wave device comprises;
- a substrate made of a single crystal of X-cut (X-θY cut) Langasite ($La_3Ga_5SiO_{14}$) and having a surface; and
- an electrode structure formed on the surface of said substrate.

The surface acoustic wave device according to the first aspect of the invention has a particularly large reflection, and thus it is preferably constituted as a surface acoustic wave resonator. Further it is preferable to form the substrate by a Langasite single crystal which is cut such that a rotation angle θ from an Y axis about an X axis is set to a value within a range from 15° to 35°, particularly from 20° to 30°.

Heretofore, upon designing the surface acoustic wave resonator, in order to increase an amount of reflection, the number of electrodes has to be increased. Then, a phase property is liable to be degraded. According to the invention, the reflection can be increased without increasing the number of electrodes, and therefore the phase characteristic can be improved According to a second aspect of the invention, a surface acoustic wave device comprises:
- a substrate made of a single crystal of rotation Y-cut (αY-X cut) Langasite ($La_3Ga_5SiO_{14}$) and having a surface; and
- an electrode structure formed on the surface of the substrate.

This surface acoustic wave device has a very small reflection, and therefore is particularly suitable for constituting a surface acoustic wave filter. It is preferable that the substrate is made of a Langasite single crystal which is cut such that a rotation angle α from the Y axis is set to a value within a range from −5° to 10°.

In the known transversal type surface acoustic wave filter, the characteristics are deformed by the reflection due to electrodes. However, in the surface acoustic wave filter according to the invention, since the reflection due to electrodes is very small, the deformation in characteristics does not occur.

According to a third aspect of the present invention, a surface acoustic wave device comprises:
- a substrate made of a single crystal of a double rotation Y-cut (αY-θX cut) Langasite ($La_3Ga_5SiO_{14}$) and having a surface; and
- an electrode structure formed on said surface of the substrate.

Such a surface acoustic wave device has an anisotropic property which realizes the natural single-phase unidirectional transducer and may be advantageously constructed as a surface acoustic wave filter by providing an electrode structure which reveals the natural single-phase unidirectional transducer property together with the anisotropy of the substrate. In this manner, it is possible to obtain a surface acoustic wave filter having a very small loss.

It has been experimentally confirmed that the NSPUDT property can be obtained for the Langasite single crystal which is cut such that a rotation angle α from the Y axis is set to a value within a range from 0° to 30° and a rotation angle θ from the X axis is 0° to 20°. However, it has been confirmed that the NSPUDT property may be obtained for cut angles beyond said ranges.

It should be noted that the Langasite single crystal has not been practically used as a substrate for the surface acoustic wave device, but has been considered to be used as such a substrate. It has been reported that the Langasite single crystal belongs to the trigonal system to which the quartz crystal also belongs, and has a higher electro-chemical coupling coefficient $K^2$ and a higher phase transition temperature than the quartz crystal ("The 17$^{th}$ ULTRASONIC SYMPOSIUM Preliminary Theses", page 305, 1996). Further, in "1996 IEEE INTERNATIONAL FREQUENCY CONTROL SYMPOSIUM, FILTER AND RESONATOR USING LANGASITE", pp. 379–382, 1996, it has been reported that a Langasite single crystal is used as a substrate for a bulk resonator which is different from the surface acoustic wave device. Several reports have been made about a velocity of surface acoustic wave, an electro-mechanical coupling coefficient $K^2$ and temperature characteristics for the Langasite single crystal. However, heretofore, the electrode reflection property has not been discussed. Among others, there has not been known that the Langasite single crystal shows the unidirectionality due to the anisotropy and reveals a possibility of the NSPUDT property.

In the present invention, a theoretical analysis has been conducted for a surface acoustic wave of a Rayleigh wave type. To this end, the Cambell & Jones method has been utilized, said method being widely used for calculating a phase velocity of surface acoustic wave and electric potential. Furthermore, the reflection coefficient of strip electrodes and NSPUDT revealing cut angles have been sought by using a combination of two theories, one being the mode coupling theory which reflects the perturbation effect as a primary effect upon the analysis for the operation of an interdigital transducer (IDT), and the other being the perturbation theory by means of which, mode coupling parameters such as particle velocity of surface acoustic wave, electric potential, material of strip electrode and dependency upon the electrode structure may be expressed as a closed equation. Moreover, material constants of the Langasite single crystal have been referred to those reported by Kaminskii, Silvestrova and others. As a result of such a theoretical analysis, it has been confirmed that the Langasite single crystal can be used as an excellent substrate of the surface acoustic wave device.

DESCRIPTION OF THE PREFERRED EMBODIMENT

In the following explanation, a propagating direction of surface acoustic wave on a substrate is denoted as $X_1$ axis, a direction normal to a surface of the substrate is expressed as $X_3$, and the cutting orientation of substrate and propagating direction are represented by the right hand Euler angle notation $(\lambda, \mu, \theta)$. In the mode coupling (COM) theory, four main parameters in a mode coupling equation, i.e. self-coupling coefficient $\kappa_{11}$, mutual coupling coefficient $\kappa_{12}$, transduction coefficient $\zeta$ and electrostatic capacitance per unit length C are directly related to the electrode reflection. Among these parameters, the mutual coupling coefficient $\kappa_{12}$ is a most important parameter for revealing the NSPUDI property which utilizes positively the anisotropy of the substrate and the reflection by the strip electrodes. In a conventional bidirectional interdigital transducer IDT, the mutual coupling coefficient $\kappa_{12}$ is a real number, but in the NSPUDT and SPUDT which utilizes the asymmetry in the construction, the mutual coupling coefficient $\kappa_{12}$ becomes a complex number.

By the first order perturbation theory, the mutual coupling coefficient $\kappa_{12}$ normalized by a wavelength $\lambda$ of a surface acoustic wave may be represented as follows:

$$\kappa_{12}\lambda = |\kappa_{12}|\lambda e^{j2\phi_0} = K_E + K_M \frac{h}{\lambda} e^{j2\phi_M} \quad (1)$$

Here, h is a thickness of electrode film, the first term $K_E$ on the right denotes the electric perturbation of electrode, and the second term on the right represents the elastic perturbation.

Between the mutual coupling coefficient $\kappa_{12}$ and the reflection coefficient of electrode per unit wavelength, there is the following relation:

$$r_+ = -j\kappa_{12}^*\lambda, r_- = -j\kappa_{12}\lambda \quad (2)$$

Here, * denotes a complex conjugate symbol, and $r_+$ and $r_-$ represent the reflection coefficients viewed in $+X_1$ and $-X_1$ directions, respectively. It should be noted that in the NSPUDT substrate, $r_+ \neq r_-$.

Now a phase condition for attaining an optimum NSPUDT operation may be given by the following equation.

$$arg(\kappa_{12}\lambda) = \pm 90°, (\phi_0 = \pm 45°) \quad (3)$$

Figure 1:
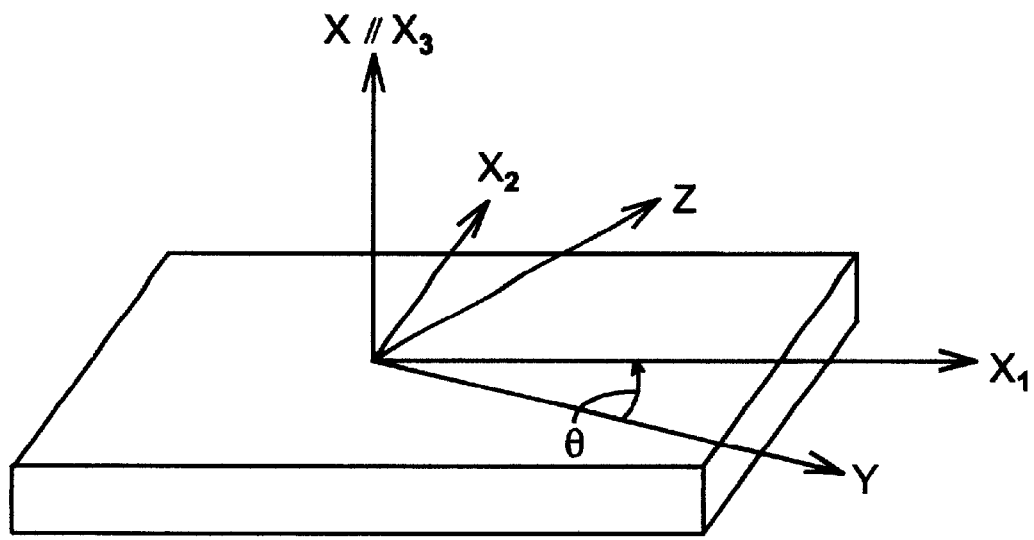
FIG. 1 is a schematic view explaining the cut angle of the X-cut Langasite single crystal of the surface acoustic wave device according to the invention.

Here, a positive sign is applied when the forward direction is identical with the direction $+X_1$ in FIG. 1 and a negative sign is used when the forward direction is $-X_1$.

When it can be assumed that the electrode has a sufficiently large thickness and the electric perturbation term can be ignored, a phase angle $2\phi_0$ of the mutual coupling coefficient $\kappa_{12}$ is determined by a phase angle $2\phi_M$ of the elastic perturbation term. Therefore, it can be understood that an optimum NSPUDT operation can be attained for $\phi_M = \pm 45°$.

The inventors have calculated values of the surface acoustic wave velocity $V_R$, electro-mechanical coupling coefficient $K^2$ and $K_E$, $K_M$ and $\phi_M$ in the equation (1). Now a result of this calculation will be shown.

Figure 2A:
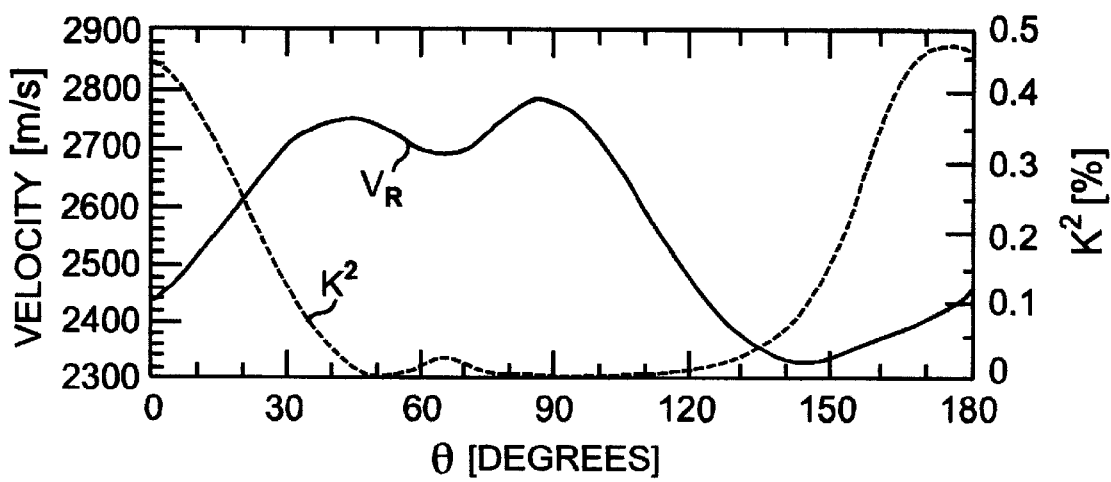
FIGS. 2A–2C are graphs showing the dependency of various characteristics of the substrate shown in FIG. 1 upon the cut angle θ.
Figure 2B:
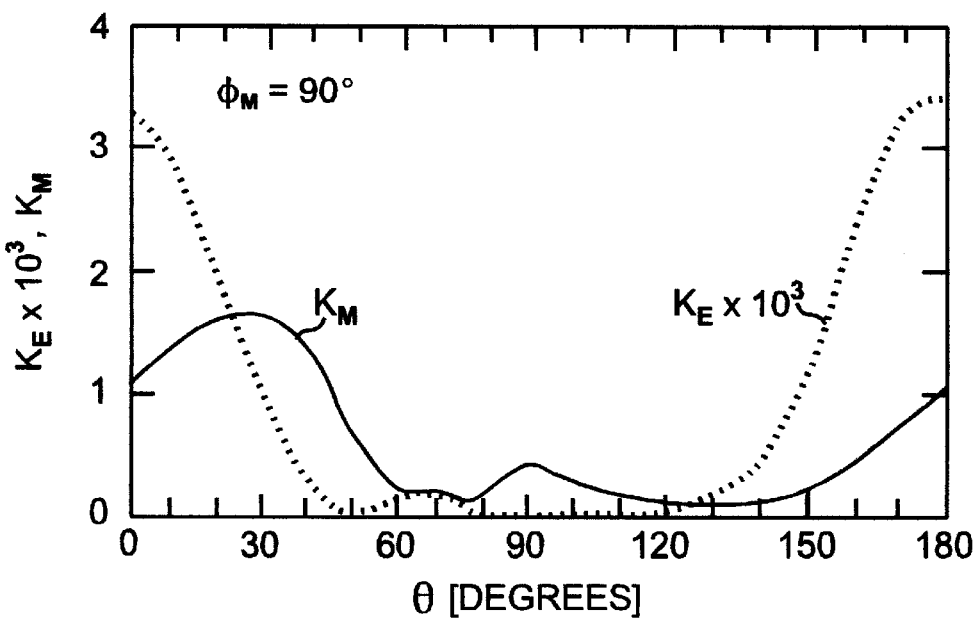
Figure 2C:
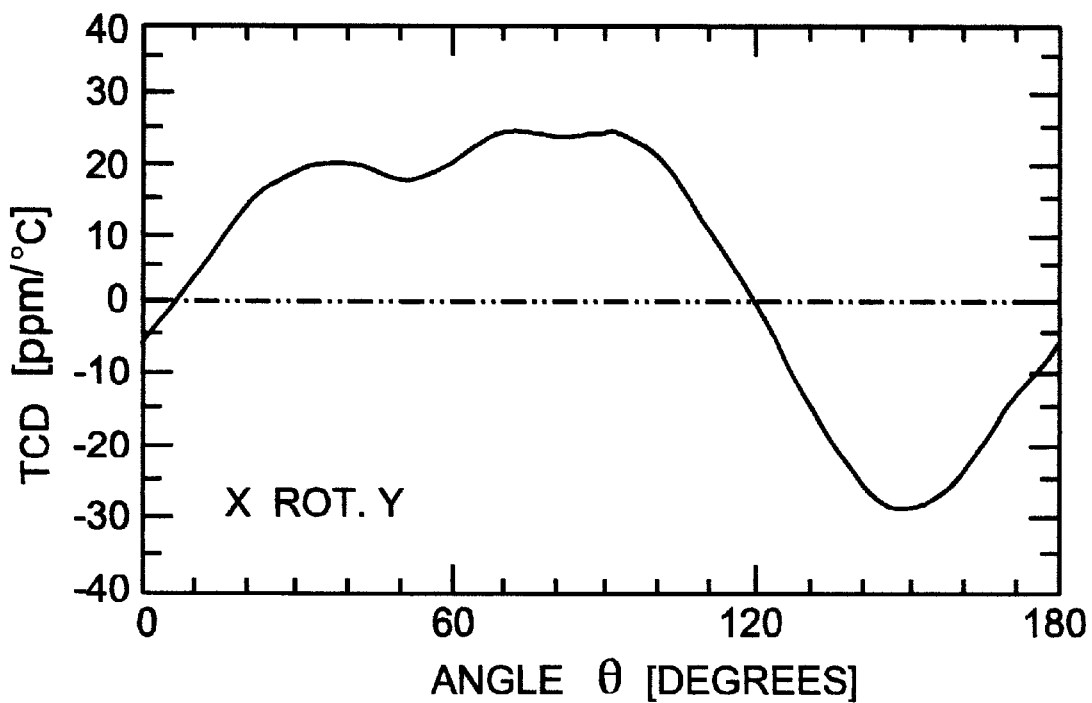

FIG. 1 illustrates an X-θY cut Langasite single crystal which shows the zero temperature dependency. In this X-θY cut, a major surface of the Langasite single crystal substrate is taken on Y-Z plane and the propagating direction $X_1$ of surface acoustic wave is rotated from the Y axis by a rotation angle θ about the X axis which is perpendicular to the Y-Z plane. The surface acoustic wave propagation and temperature dependency TCD in such an X-θY cut Langasite single crystal substrate are shown in FIGS. 2A–2C. The electrode is made of aluminum. FIG. 2A shows the acoustic velocity $V_R$ and electromechanical coupling coefficient $K^2$, FIG. 2B represents the mutual coupling coefficient, and FIG. 2C denotes the temperature coefficient of delay time TCD. It should be noted that in FIG. 2B, the electric perturbation term $K_E$ is denoted being multiplied by $10^3$, and thus the mutual coupling coefficient, i.e. the reflection coefficient is mainly determined by the elastic perturbation term $K_M$.

As can be seen from FIGS. 2A–2C, in the X-θY cut Langasite single crystal, it is possible to obtain a relatively large $K_M$ representing the reflection coefficient due to the elastic perturbation for the rotation angle θ within a range from 15° to 35°. Particularly, $K_M$ becomes a maximum value ($K_{M=}1.64$) in a vicinity of θ≅20–30° at which the temperature dependency is also good. The value is higher than that of the conventional ST-X cut quartz by about 1.5. Within the above range of the cut angle θ≅20–30°, the temperature dependency is rather small. Therefore, the X-θY cut Langasite single crystal substrate can be particularly advantageously used as a substrate for the surface acoustic wave resonator. $\phi_M$ has a constant value of +90° in all propagating directions. In the ST-X cut quartz, $\phi_M = 0$. This means that a phase of the reflection coefficient due to the elastic perturbation represented by the above equations (1) and (2) differs from that of the ST-X cut quartz by 180°. Upon designing the surface acoustic wave resonator or SPUDT, this point should be taken into consideration. Further, since $\phi_M$ has the constant value of +90°, it can be presumed that an X-cut Langasite single crystal does not show the NSPUDT property.

Figure 3:
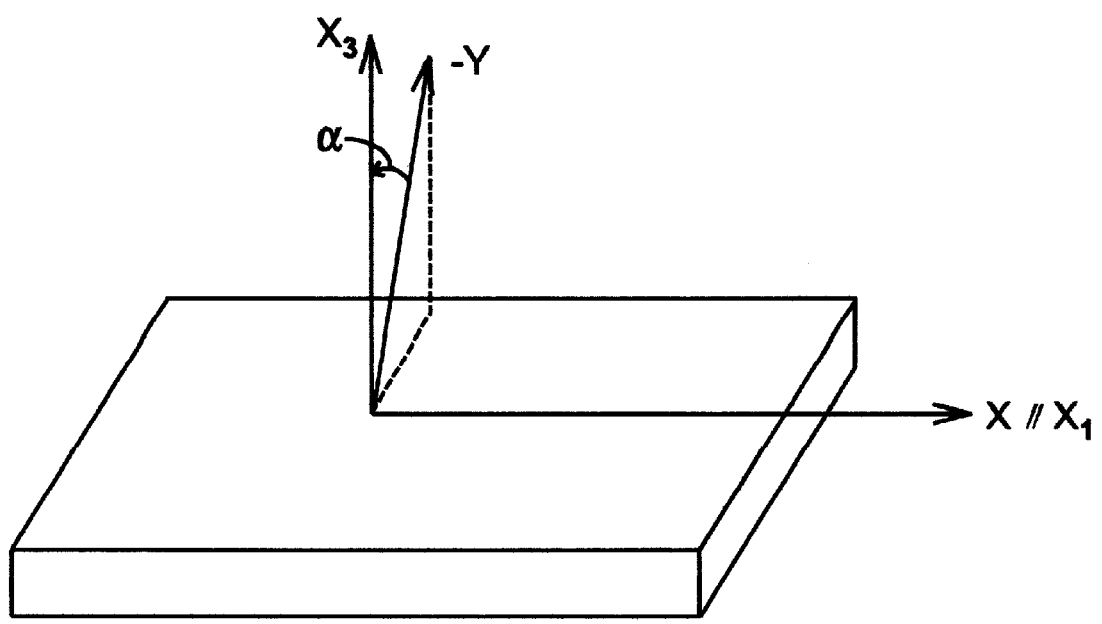
FIG. 3 is a schematic view explaining the cut angle of the rotation Y-cut Langasite single crystal of the surface acoustic wave device according to the invention.
Figure 4A:
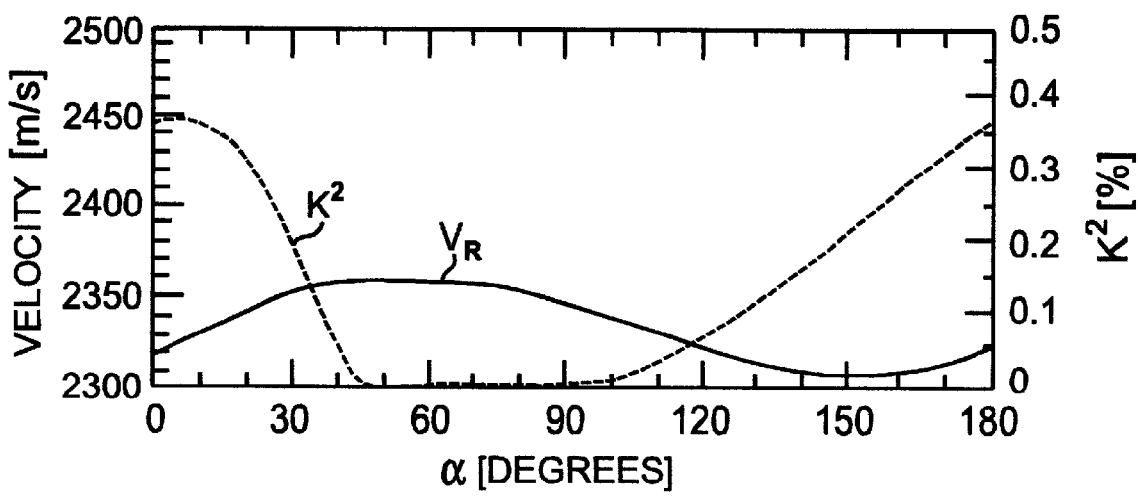
FIGS. 4A–4C are graphs showing the dependency of various characteristics of the substrate shown in FIG. 3 upon the cut angle α.
Figure 4B:
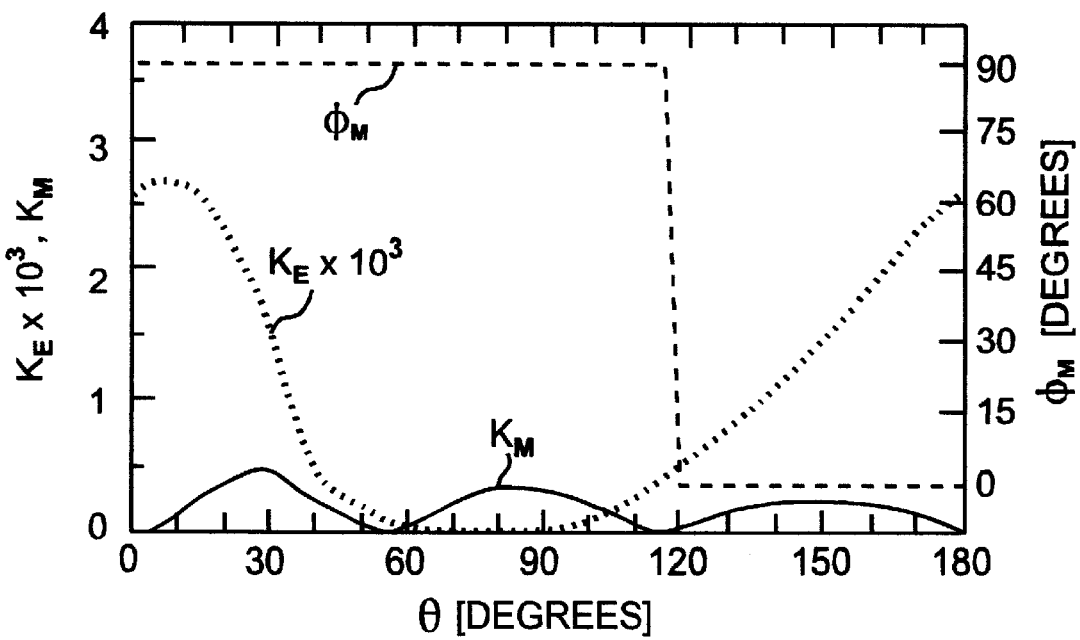
Figure 4C:
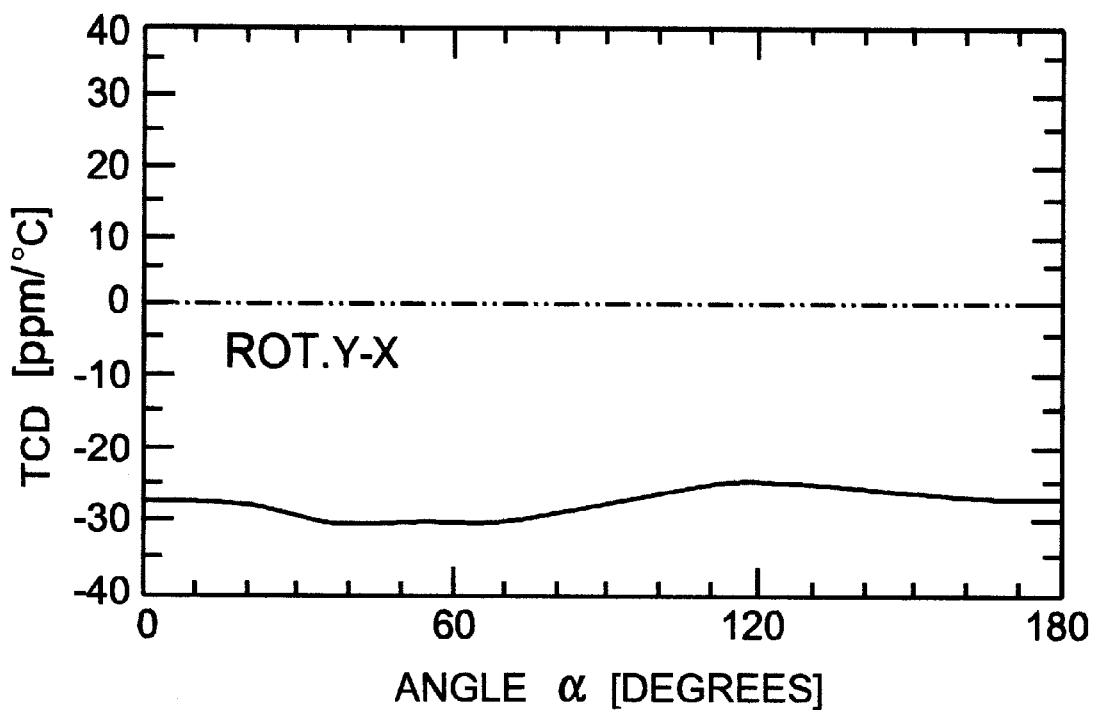

FIG. 3 depicts an α rotation Y-cut Langasite single crystal according to the invention. In this α rotation Y-cut, a crystal axis X of the Langasite single crystal substrate is in parallel with the propagating direction $X_1$ of surface acoustic wave and the $X_3$ axis is rotated from the -Y axis by a rotation angle α about the crystal axis X. Characteristics of this α rotation Y-cut Langasite single crystal substrate are shown in FIGS. 4A–4C. Also in this embodiments, the electrode is made of aluminum. FIG. 4A depicts the acoustic velocity $V_R$ and electro-mechanical coupling coefficient $K^2$, FIG. 4B illustrates changes in $K^E$, $K_M$ and $\phi_M$ with respect to the cut angle $\alpha$, and FIG. 4C represents the temperature coefficient of delay time TCD. In the $\alpha$ rotation Y-cut Langasite single crystal, the electro-mechanical coupling coefficient $K^2$ is relatively large and $K_M$ has a relatively small value for the rotation angle $\alpha$ within a range from $-5°$ to $10°$. Particularly at $\alpha=5°$, $K^2$ becomes maximum and $K_M$ becomes substantially zero. That is to say, in this $\alpha$ rotation Y-cut, it has been found that the reflectivity due to the elastic perturbation by the strip electrode does scarcely occur. The power flow angle PFA is zero in regardless of the cut angle $\alpha$. Moreover, although the temperature coefficient of delay time TCD is not zero, it is substantially constant in regardless of the cut angle $\alpha$. Therefore, the $\alpha$ rotation Y-cut Langasite single crystal is particularly suitable for the substrate of the surface acoustic wave filter.

$\phi_M$ of the $\alpha$ rotation Y-cut Langasite single crystal is zero for $\alpha \cong 120$–$180°$, which is identical with the ST-X cut quartz, but in the remaining cut angle range, $\phi_M$ is $90°$ like as the previous embodiment. In this manner, it has been found that the $\alpha$ rotation Y-cut Langasite single crystal does not reveal the NSPUDT property, because $\phi_M=+90°$ or $0°$.

Figure 5:
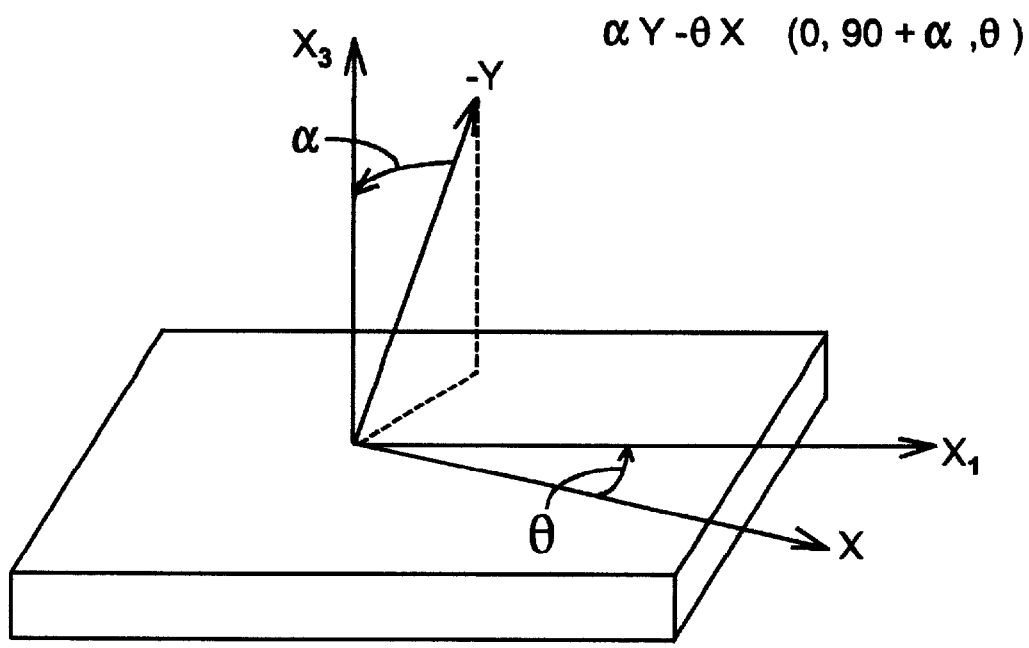
FIG. 5 is a schematic view explaining the cut angle of the double rotation Y-cut Langasite single crystal of the surface acoustic wave device according to the invention.

FIG. 5 shows an embodiment of the double rotation Y-cut Langasite single crystal substrate according to the present invention. This substrate can be obtained by rotating the surface acoustic wave propagating direction $X_1$ of a $5°$ Y-cut Langasite single crystal over a rotation angle of $\theta$ from the crystal axis X. It should be noted that the $5°$ Y-cut Langasite single crystal has a maximum electro-mechanical coupling coefficient $K^2$.

Figure 6A:
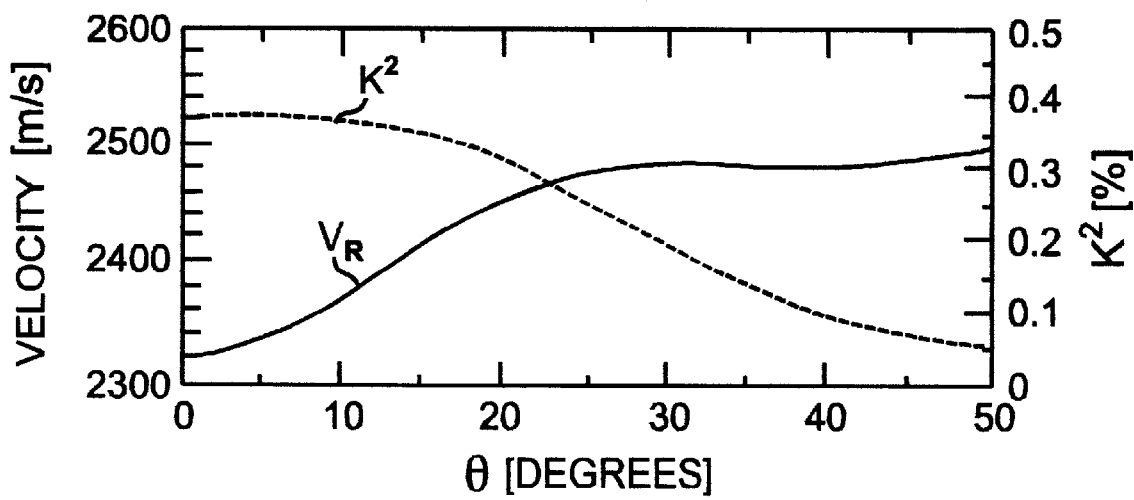
FIGS. 6A–6C are graphs showing the dependency of various characteristics of the substrate shown in FIG. 5 upon the cut angle θ.
Figure 6B:
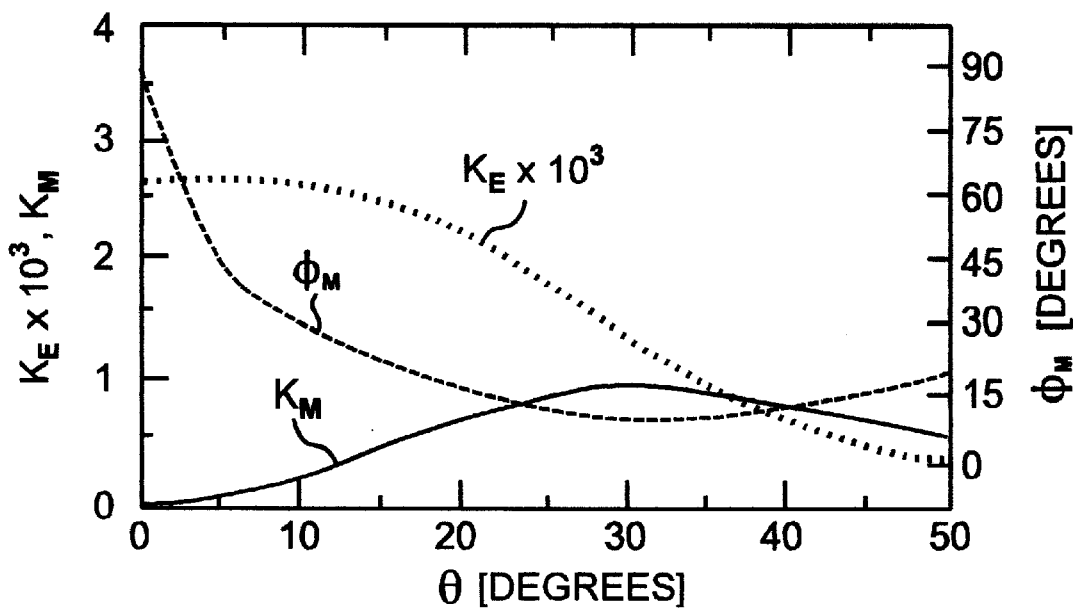
Figure 6C:
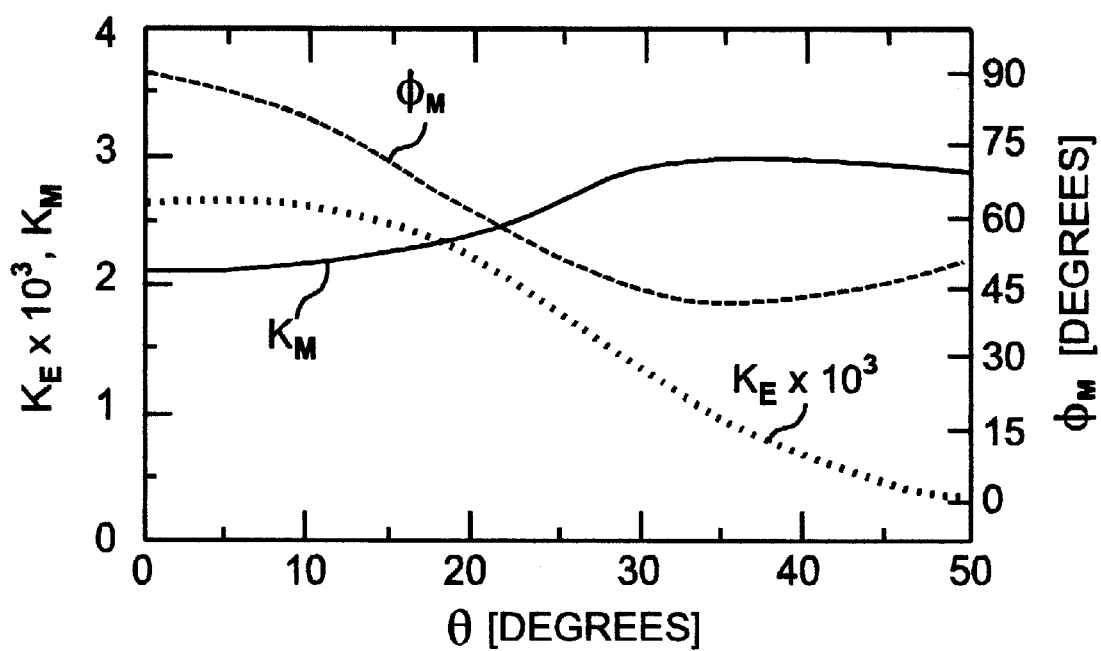

FIG. 6A shows the acoustic velocity $V_R$ and electro-mechanical coupling coefficient $K^2$, FIG. 6B represents changes in $K_E$, $K_M$ and $\phi_M$ with respect to the cut angle $\theta$ when electrodes are made of aluminum, and FIG. 6C illustrates changes in $K_E$, $K_M$ and $\phi_M$ with respect to the cut angle $\theta$ when electrodes we made of gold (Au). As shown in FIG. 6B, when electrodes are made of aluminum, at $\theta \cong 5°$, $\phi_M=+45°$, which shows that this Langasite single crystal reveals an optimum NSPUDT property. However, $K_M$ in this orientation is rather small, and therefore it is necessary to increase a thickness of the aluminum electrodes or the number to strip electrodes in order to realize a large directionality.

When the electrodes are made of gold, a phase condition for attaining the optimum NSPUDT property is satisfied for a wide range of $\theta \cong 30$–$40°$ and $K^2$ has a large value. In this manner, it has been found that the optimum NSPUDT operation can be obtained by using the double rotation Y-cut Langasite single crystal as the piezo-electric substrate of the surface acoustic wave device and by using the gold electrodes.

Figure 7:
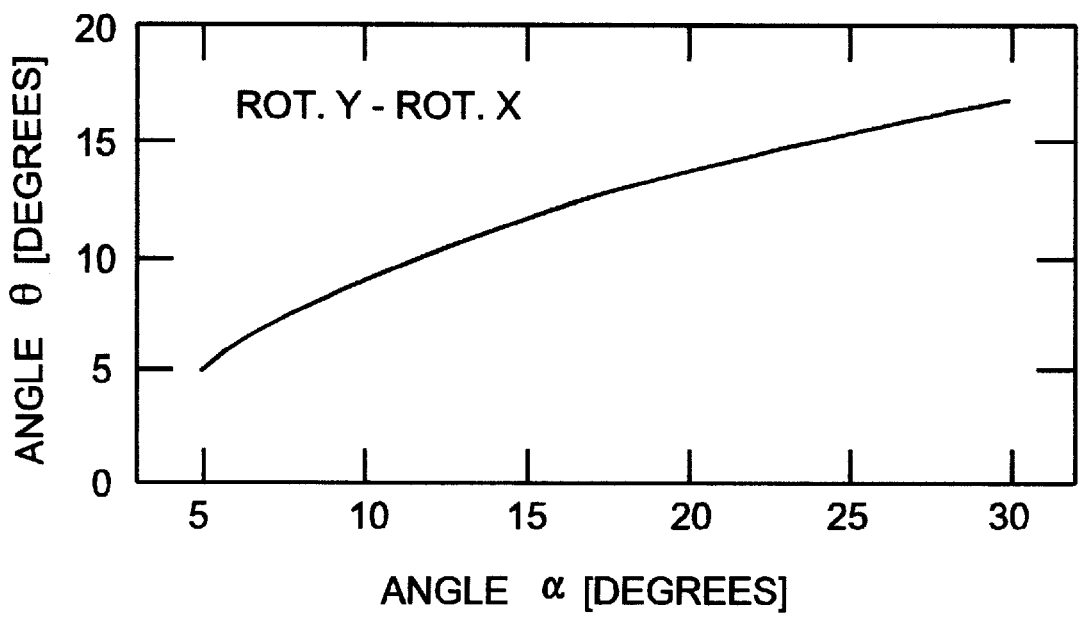
FIG. 7 is a graph representing cut angles α and θ at which the NSPUD property reveals in the substrate illustrated in FIG. 5.

FIG. 7 represents a combination of the cut angles $\alpha$ and $\theta$ at which the phase condition of $\phi_M=+45°$ for realizing the optimum NSPUDT property can be obtained in the double rotation Y-cut Langasite single crystal. It should be noted that the NSPUDT substrate may be realized at cut angles $\alpha$ and $\theta$ which are not on the curve in FIG. 7. For instance, although the cut angle $\theta$ deviates from the curve by about $\pm 5°$, it is still possible to obtain the NSPUDT substrate.

Figure 8:
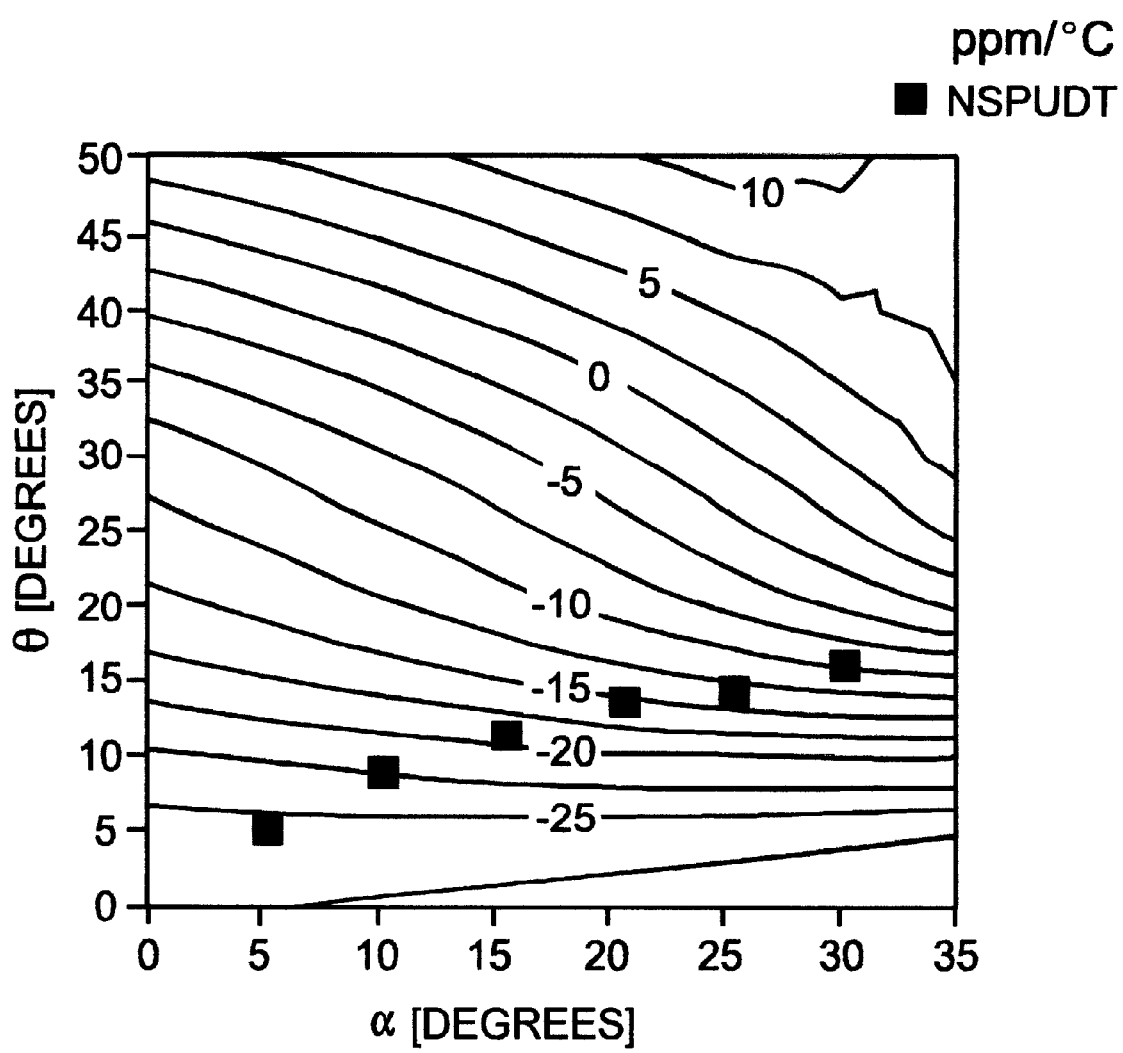
FIG. 8 is a graph showing the temperature characteristic of the substrate shown in FIG. 5.

FIG. 8 is a graph showing the temperature coefficient of delay time of the double rotation Y-cut Langasite single crystal, while the cut angle $\alpha$ is denoted on the horizontal axis and the cut angle $\theta$ on the vertical axis. In FIG. 8, black square plots represent points at which the phase condition for attaining the optimum NSPUDT property is realized for the aluminum electrodes. The temperature dependency becomes better upon increasing the cut angles $\alpha$ and $\theta$. However, even in a region of small cut angles $\alpha$ and $\theta$, it has been confirmed that a practically acceptable temperature dependency can be obtained.

Figure 9:
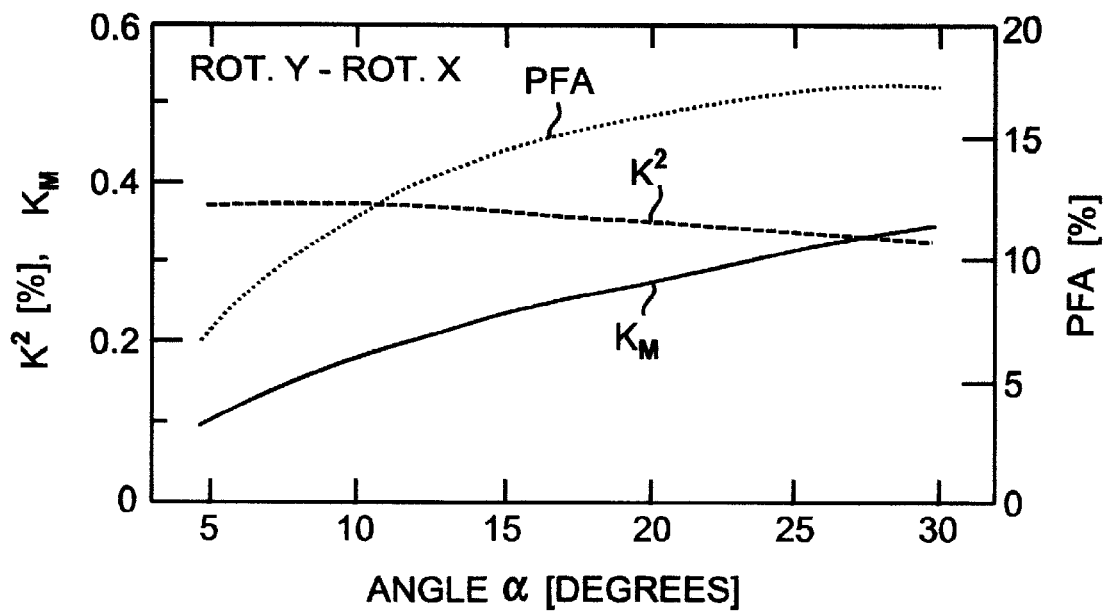
FIG. 9 is a graph illustrating variations in various characteristics of the substrate shown in FIG. 5 in accordance with the cut angle α.

FIG. 9 sows changes in the electro-mechanical coupling coefficient $K^2$, $K_M$ representing a magnitude of the reflection coefficient due to the elastic perturbation effect and the power flow angle PFA in the double rotation Y-cut Langasite single crystal substrate, while the cut angle $\alpha$ is taken as a parameter and the cut angle $\theta$ is set to a value at which the NSPUDT property is realized as shown in FIG. 7. The power flow angle PFA is not zero and increases in accordance with the increase in the cut angle $\alpha$, but its value is still within a practically acceptable range.

Figure 10:
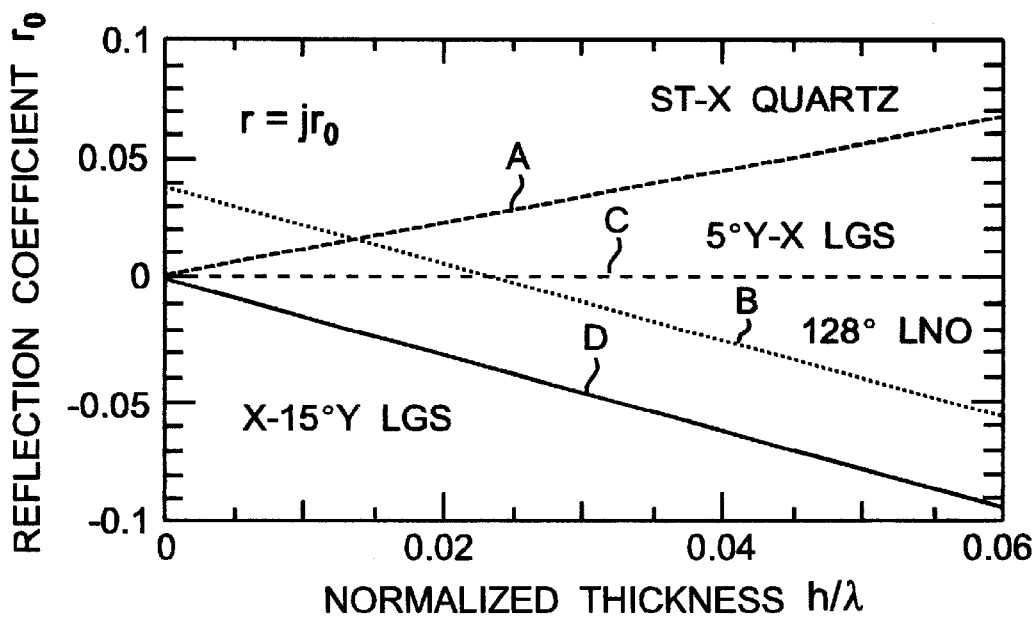
FIG. 10 is a graph representing changes in the reflectivity of the substrate of FIG. 5 and of a known substrate in comparison.

FIG. 10 is a graph representing changes in the reflection coefficient $r_0$ of various piezoelectric substrates in accordance with a thickness of aluminum electrodes. The thickness is normalized by the wavelength $\lambda(h/\lambda)$. In FIG. 10, a line A shows the reflectivity of a known ST-X cut quartz, a line B a known $128°$ Y-cut lithium niobate, a line C a $5°$ Y-cut Langasite single crystal according to the invention and a line D represents the reflection coefficient of an X-$15°$ Y cut Langasite single crystal according to the invention. As shown by the line C, the reflectivity of the $5°$ Y-X cut Langasite single crystal according to the invention is substantially zero in regardless of the thickness of the aluminum electrodes, and thus this Langasite single crystal can be advantageously used a substrate for the transversal type surface acoustic wave filter. Furthermore, in the X-$15°$ Y cut Langasite single crystal according to the invention, it is possible to obtain the large reflectivity as shown by the line D. Therefore, this Langasite single crystal can be preferably used as a substrate of the surface acoustic wave resonator or resonator type filter.

As explained above, the X-cut Langasite single crystal showing the large reflection by electrodes may be used for the surface acoustic wave resonator, and the rotation Y-cut Langasite single crystal having the small reflection coefficient may be advantageously used in the surface acoustic wave filter. Further, by using the double rotation Y-cut Langasite single crystal substrate, it is possible to attain the NSPUDT operation, and therefore this substrate can be particularly advantageously used for the surface acoustic wave filter having a small insertion loss.

The Langasite single crystal of the surface acoustic wave device according to the invention has the electro-chemical coupling coefficient $K^2$ in a range of 0.37–0.46, which is larger than that of the conventional ST-X cut quartz. The propagating velocity $V_R$ of surface acoustic wave of the Langasite single crystal is about 2323–2410 m/s, which is lower than a conventional value. Therefore, according to the invention, it is possible to realize the surface acoustic wave device which is small in size, light in weight and low in power consumption. It should be noted that in case of using aluminum electrodes, the propagating velocity becomes extremely lower under the aluminum electrodes than in other region, and in case of using gold electrodes, the propagating velocity under the gold electrodes is substantially identical with that in other region. By utilizing this fact, it is possible to construct a surface acoustic wave guide. That is to say, since the surface acoustic wave has a tendency to be concentrated in a region in which the propagating velocity is higher than the remaining portion, by providing aluminum electrodes in the vicinity of the guide to increase the propagating velocity, it is possible to realize the surface acoustic wave guide having low loss and low dispersion.

Next, the transduction property in the NSPUDT operation obtained by using the above mentioned double rotation Y-cut Langasite single crystal will be explained.

Figure 11:
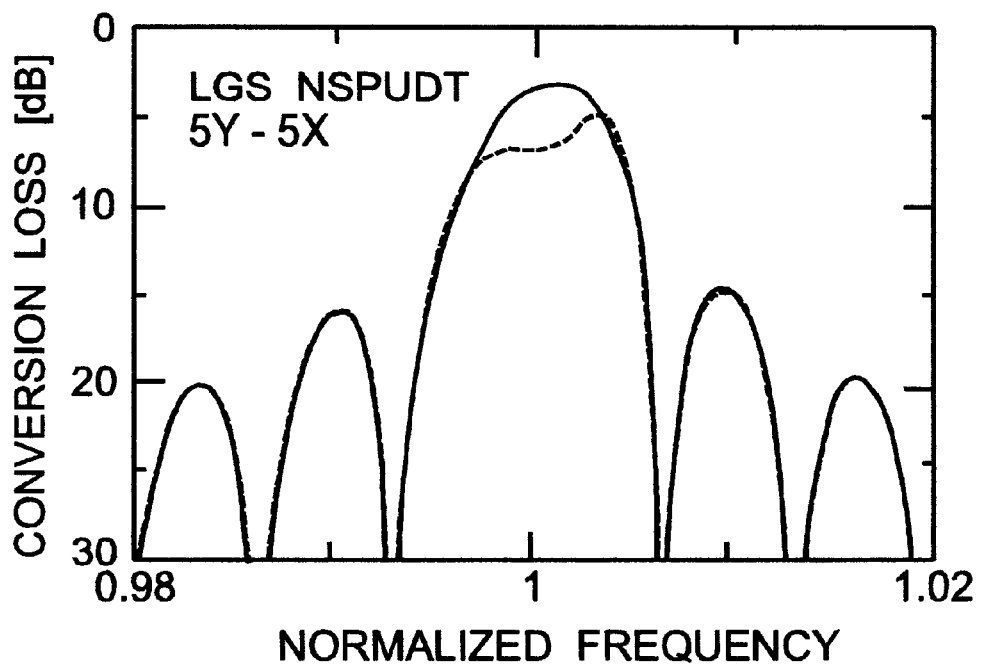
FIG. 11 is a graph showing the NSPUDT property of an embodiment of the Langasite single crystal for use in the surface acoustic wave device according to the invention.
Figure 12:
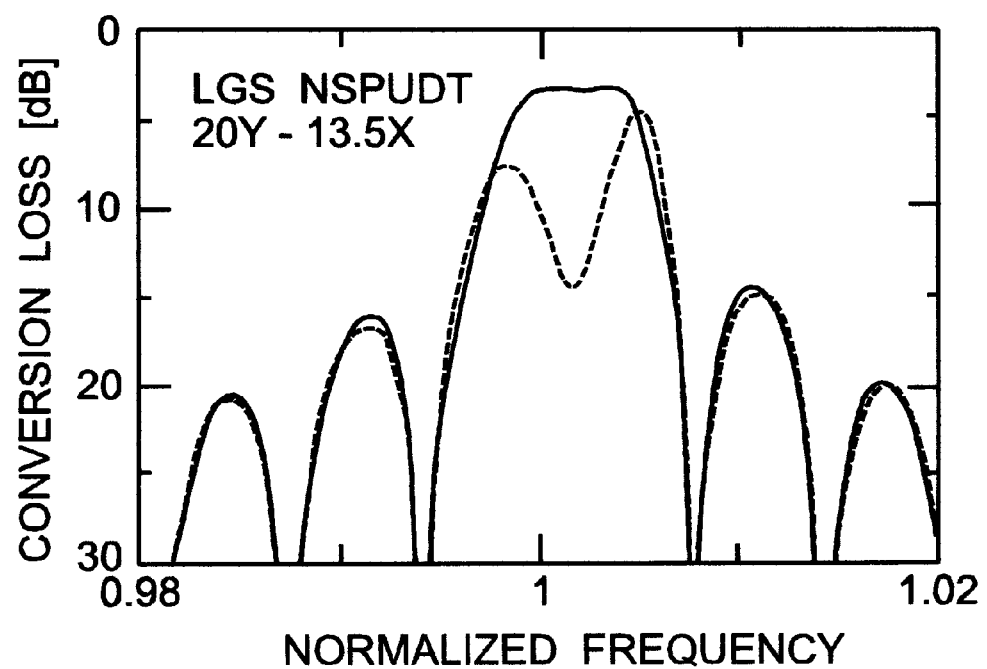
FIG. 12 is a graph representing the NSPUDT property of another embodiment of the Langasite single crystal for use in the surface acoustic wave device according to the invention.
Figure 13:
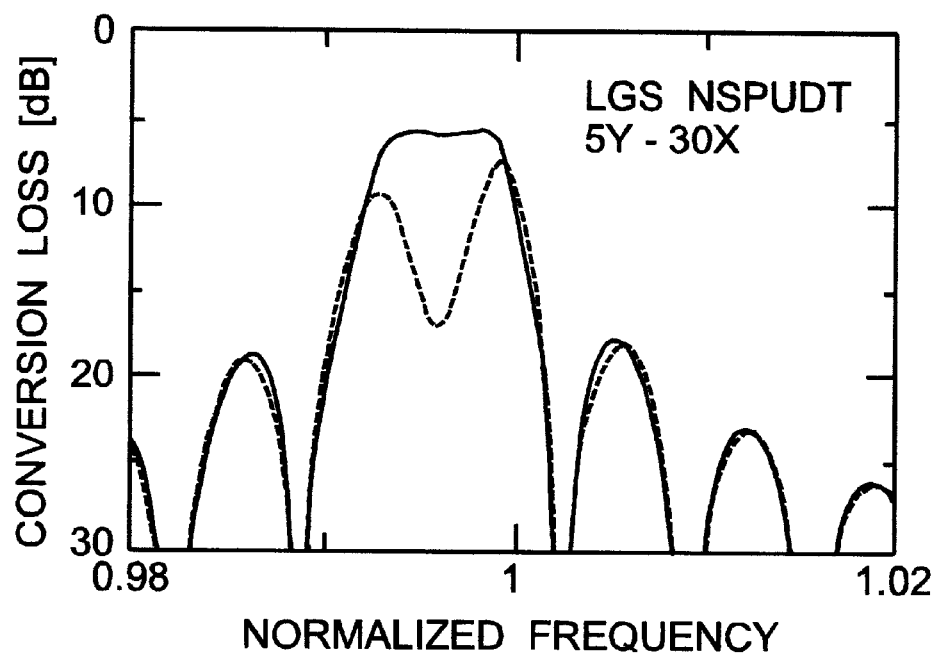
FIG. 13 is a graph showing the NSPUDT property of still another embodiment of the Langasite single crystal for use in the surface acoustic wave device according to the invention.

FIGS. 11, 12 and 13 represent the conversion loss of NSPUDT surface acoustic wave devices each comprising the normal type electrode structure having 150 pairs of interdigital electrode fingers and an aperture length of 100λ. FIG. 11 shows the device, in which use is made of a double rotation Y-cut Langasite single crystal having the rotation angles α=5° and θ=5° (in Euler angle notation (0°, 95°, 5°) cut), the electrodes are made of aluminum, and a ratio of a thickness h of the electrodes to a wavelength λ of surface acoustic wave h/λ is set to 0.03. FIG. 12 represents the conversion loss of the device comprising a double rotation Y-cut Langasite single crystal having the rotation angles α=20° and θ=13.5° (in Euler angle notation (0°, 110°, 13.5°) cut), the electrodes are made of aluminum, and a ratio of a thickness h of the electrodes to a wavelength λ of surface acoustic wave h/λ is set to 0.03. FIG. 13 shows the conversion loss of the device, in which a double rotation Y-cut Langasite single crystal having the rotation angles α=5° and θ=30° (in Euler angle notation (0°, 95°, 30°) cut) is used as the substrate, the electrodes are made of gold, and a ratio of a thickness h of the electrodes to a wavelength λ of surface acoustic wave h/λ is set to 0.003. In FIGS. 11, 12 and 13, solid lines denote the conversion loss in the $-X_1$ direction and broken lines show the conversion loss in the $+X_1$ direction. At a center frequency, a difference between the forward conversion loss and the backward conversion loss is large, and this shows the unidirectionality. Particularly, in FIGS. 12 and 13, very large NSPUDT operation can be recognized. Upon co ing these figures, it can be understood that when the electrodes are made of aluminum, the center frequency has a tendency to be higher, but when the electrodes are made of gold, the center frequency has a tendency to be lower. However, the latter tendency is not so large. This is on; the unique characteristics of the Langasite single crystal according to the invention.

As explained above, the double rotation Y-cut Langasite single crystal substrate according to the invention reveals the excellent unidirectionality. When such a substrate is applied to the surface acoustic wave filter, the construction of electrodes has to be taken into consideration. That is to say, if transmitter and receiver side transducers having the same electrode structure are provided on the NSPUDT substrate, the forward direction of the transmitter side transducer is identical with the forward direction of the receiver side transducer, and thus the insertion loss becomes large. In order solve such a problem, it is necessary to invert or reverse the directionality of one of the transducers or to use λ/8 double electrode structure in which the reflection is cancelled out. Various types of the directionality reversed electrode structures described in EP 0704 967 A2 may be utilized in the surface acoustic wave device according to the invention.

Figure 14:
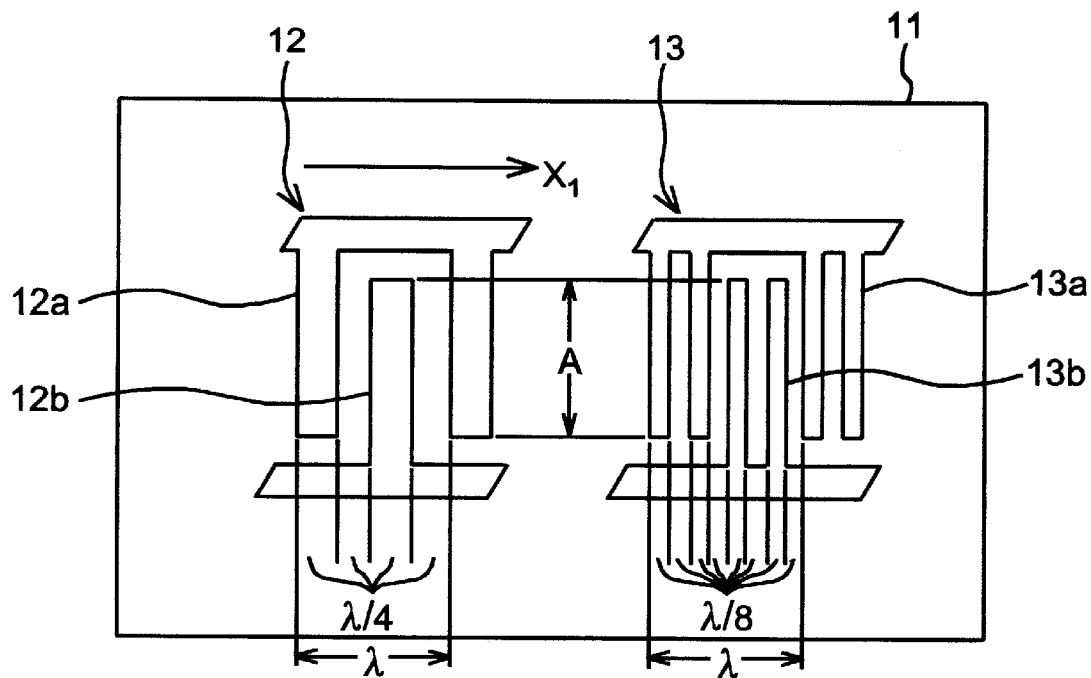
FIG. 14 is a schematic plan view showing an embodiment of the surface acoustic wave device according to the invention constructed as the surface acoustic wave filter.

FIG. 14 is a schematic plan view showing an embodiment of the surface acoustic wave device according to the invention constructed as the surface acoustic wave filter. In the present embodiment, a substrate 11 is made of a 20° Y-13.5° X cut Langasite single crystal. A transmitter side transducer 12 is formed by a normal type electrode structure having positive and negative interdigital electrode fingers 12a and 12b each having a width of λ/4 and an edge distance of λ/4. In combination of this normal type electrode structure with the Langasite single crystal substrate 11, the NSPUDT operation is realized and the transmitter side transducer 12 has the directionality in $X_1$. The number of electrode finger pairs is fifty. An aperture length A is about 200 μm, said aperture length being defined as a length over which the positive and negative electrodes are overlapped with each other. A receiver side transducer 13 comprises a double electrode structure, in which two positive electrode fingers 13a and two negative electrode fingers 13b are arranged alternately with an edge distance of λ/8, and each of the electrode fingers 13a, 13b has a width of λ/8. The number of electrode finger pairs is fifty. The electrodes of the transmitter and receiver side transducers 12 and 13 are made of aluminum and have a same thickness.

In this surface acoustic wave filter, the transmitter side transducer 12 formed by the normal type electrode structure has the directionality directing in $X_1$ inherent to the substrate, while the receiver side transducer 13 formed by the double electrode structure reveals the bi-directionality. Therefore, the surface acoustic wave filter has superior characteristics.

Figure 15:
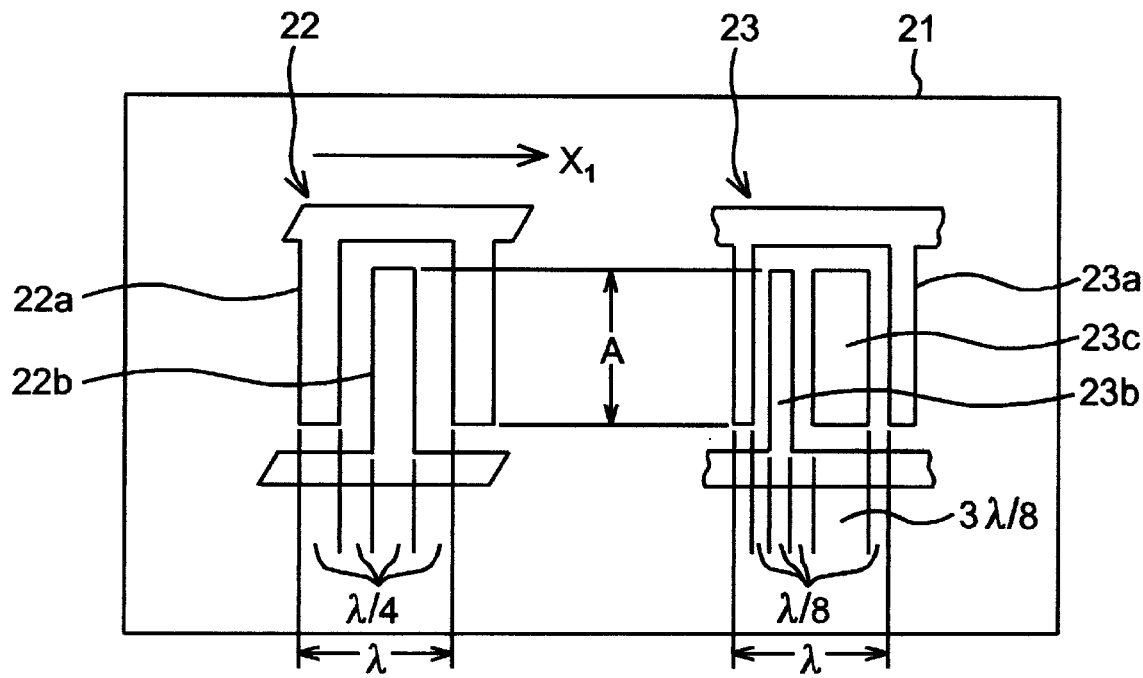
FIG. 15 is a schematic plan view depicting another embodiment of the surface acoustic wave device according to the invention formed as the surface acoustic wave filter.

FIG. 15 is a schematic plan view showing another embodiment of the surface acoustic wave filter according to the invention. Also in the present embodiment, a substrate 21 is made of a 20° Y-13.5° X cut Langasite single crystal, and a transmitter side transducer 22 is formed by the normal type electrode structure having positive and negative interdigital electrode fingers 22a and 22b each having a width of λ/4 and an edge distance of λ/4. A receiver side transducer 23 is formed by a floating type electrode structure comprising positive and negative interdigital electrode fingers 23a and 23b each having a width of λ/8, and floating electrodes 23c having a width of 3λ/8. The positive and negative electrode fingers 23a and 23b and floating electrodes are arranged with an edge distance of λ/8. This floating type electrode structure of the receiver side transducer 23 reveals the inverted directionality which is opposite to the direction $X_1$. All the electrodes are made of aluminum and have a same thickness. The number of electrode finger pairs is fifty and an aperture length A is about 200 μm.

In the present embodiment, the transmitter side transducer 22 has the directionality in $X_1$ and the receiver side transducer 23 has the directionality in $-X_1$, and therefore, the surface acoustic wave filter has a particularly small insertion loss.

As described above, according to the invention, by using the X-cut Langasite single crystal, rotation Y-cut Langasite single crystal and double rotation Y-cut Langasite single crystal as the substrate of the surface acoustic wave device, it is possible to realize the surface acoustic wave device having the large reflection by electrodes, the surface acoustic device having the small reflection by electrodes, large electromechanical coupling coefficient $K^2$ and small power flow angle PFA, and the surface acoustic wave device having the NSPUDT property and excellent phase property. In any devices, the propagating velocity of surface acoustic wave is lower than conventional substrates, it is possible to obtain the small and light surface acoustic wave device having a low power consumption. Further, since the propagating velocity of surface acoustic wave is low, when electrodes are made of aluminum, it is possible to realize the surface acoustic wave guide in which the propagation loss and dispersion can be reduced and an undesired decrease in a center frequency can be avoided.

In the surface acoustic wave filters illustrated in FIGS. 14 and 15, the substrates are formed by the 20° Y-13.5° X cut Langasite single crystal and all the electrodes are made of aluminum. However, according to the invention, when the substrate is formed by 5° Y-30° X cut Langasite single crystal, the electrodes may be made of gold. It should be noted that when the electrodes are made of gold, it is preferable to form the substrate by the double rotation αY-θX cut Langasite single crystal, wherein α is a value within a range of 0°–30° and θ is a value within a range of 20°–50°. It is particularly preferable to set the rotation angle α to 5° and to set the rotation angle θ to a value within a range of 30°–40°. Furthermore, the known electrode structures shown in the above mentioned U.S. Pat. No. 5,698,927 and EP 0704967A2 may be utilized in combination with the Langasite single crystal substrate according o the invention.

What is claimed is:

1. A surface acoustic wave device comprising:

a substrate made of a single crystal of X-cut (X-θY cut) Langasite ($La_3Ga_5SiO_{14}$) and having a surface, said crystal having been cut such that a rotation angle θ from a Y axis about an X axis is set to a value within a range from 15° to 35°; and an electrode structure formed on the surface of said substrate.

2. A surface acoustic wave device according to claim 1, wherein said electrode structure is formed to constitutes a surface acoustic wave resonator.

3. A surface acoustic wave device according to claim 1, wherein said rotation angle θ is set to a value within a range from 20° to 30°.

4. A surface acoustic wave device comprising:

a substrate made of a single crystal of rotation Y-cut (αX-Y cut) Langasite ($La_3Ga_3SiO_{14}$) and having a surface, said crystal having been cut such that a rotation angle α from a Y axis about an X axis is set to a value within a range from −5° to 10°; and an electrode structure formed on the surface of the substrate.

5. A surface acoustic wave device according to claim 4, wherein said electrode structure is formed to constitute a surface acoustic wave filter.

6. A surface acoustic wave device comprising:

a substrate made of a single crystal of a double rotation Y-cut (αY-θx cut) Langasite ($La_3Ga_5SiO_{14}$) and having a surface, said crystal having been cut such that a rotation angle α from a Y axis about an X axis is set to a value within a range from 0° to 30° and a rotation angle θ from the X axis is set to a value within the range from 0° to 20°; and an electrode structure made of aluminum formed on said surface of said substrate, said electrode structure being formed to construct a natural single-chase unidirectional transducer property together with an anisotropy of the substrate.

7. A surface acoustic wave device according to claim 6, wherein said electrode structure include a first electrode having a directionality which is identical with a directionality inherent to the substrate, and a second electrode having a bi-directionality.

8. A surface acoustic wave device according to claim 6, wherein said electrode structure includes a first electrode having a directionality which is identical with a directionality inheren the the substrate, and a second directionality inverted type electrode having a directionality opposite to the directionality inherent to the substrate.

9. A surface acoustic wave device comprising:

a substrate made of a single crystal of a double rotation Y-cut (αY-θx cut) Langasite ($La_3Ga_5SiO_{14}$) and having a surface, said crystal having been cut such that a rotation angle α from a Y axis about an X axis is set to a value within a range from 0° to 30° and a rotation angle θ from the X axis is set to a value within the range from 20° to 50°; and an electrode structure made of gold formed on said surface of said substrate.

10. A surface acoustic wave device according to claim 9, wherein said rotation angle α is set to 5° and said rotation angle θ is set to a value within range from 30° to 40°.

11. A surface acoustic wave device according to claim 9, wherein said electrode structure is formed to construct a natural single-phase unidirectional transducer property together with an anisotropy of the substrate.

12. A surface acoustic wave device according to claim 11, wherein said electrode structure include a first electrode having a directionality which is identical with a directionality inherent to the substrate, and a second electrode having a bi-directionality.

13. A surface acoustic wave device according to claim 11, wherein said electrode structure includes a first electrode having a directionality which is identical with a directionality inherent to the substrate, and a second directionality inverted type electrode having a directionality opposite to the directionality inherent to the substrate.

* * * * *